United States Patent [19]
Miyazaki et al.

[11] Patent Number: 5,427,876
[45] Date of Patent: Jun. 27, 1995

[54] METHOD OF MANUFACTURING A PHOTOMASK

[75] Inventors: Junji Miyazaki; Hitoshi Nagata, both of Itami, Japan

[73] Assignee: Mitsubishi Denki Kabushiki Kaisha, Tokyo, Japan

[21] Appl. No.: 47,464

[22] Filed: Apr. 19, 1993

[30] Foreign Application Priority Data

Apr. 28, 1992 [JP] Japan ................................ 4-110053
Feb. 22, 1993 [JP] Japan ................................ 5-031535

[51] Int. Cl.⁶ .............................................. G03F 9/00
[52] U.S. Cl. .................................. 430/5; 430/321; 430/324
[58] Field of Search ........................ 430/5, 321, 324

[56] References Cited

U.S. PATENT DOCUMENTS

| | | | |
|---|---|---|---|
| 5,229,255 | 7/1993 | White | 430/5 |
| 5,254,418 | 10/1993 | Kamon et al. | 430/5 |
| 5,302,477 | 4/1994 | Dao et al. | 430/5 |

FOREIGN PATENT DOCUMENTS 58-173744 10/1983 Japan .
62-50811 10/1987 Japan .
1-147458 6/1989 Japan .

Primary Examiner—S. Rosasco
Attorney, Agent, or Firm—Oblon, Spivak, McClelland, Maier & Neustadt

[57] ABSTRACT

A mask pattern is transferred at a high resolution regardless of the configuration of a light shielding region. A plurality of light shielding members are disposed on a transparent substrate spaced from and parallel to each other. A main phase shifting film is formed in every other region between adjacent light shielding members on the transparent substrate in a direction along the arrangement of the light shielding members. At the periphery of the main phase shifting film, an auxiliary phase shifting film is disposed. Light through the main phase shifting film is 180 degrees out of phase from light through the transparent substrate while light through the auxiliary phase shifting film is 90 degrees out of phase from light through the transparent substrate. Due to the auxiliary phase shifting film, the intensity of transmitted light would not drop to zero at a border region between the main phase shifting film and the transparent substrate. Hence, the mask pattern is transferred at an enhanced transfer accuracy.

38 Claims, 27 Drawing Sheets

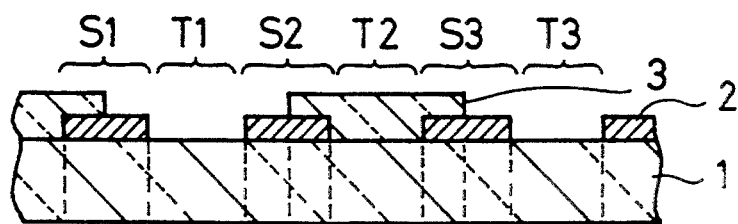
FIG. 10A
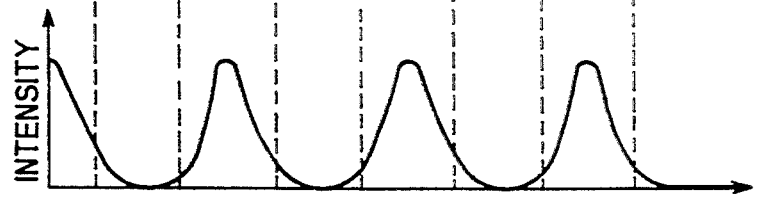
FIG. 10B
FIG. 10C

FIG. 11A
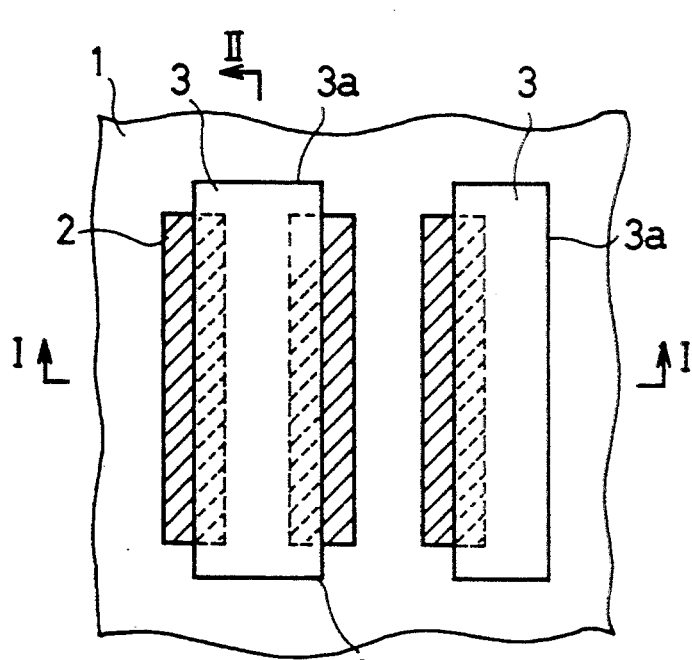
FIG. 11D
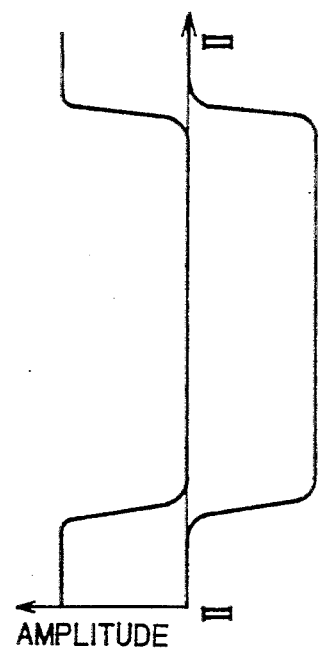
FIG. 11B
FIG. 11C
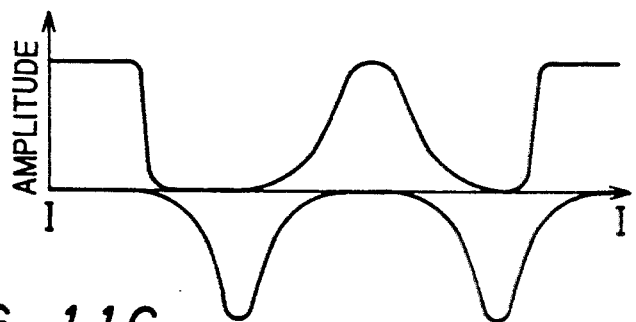
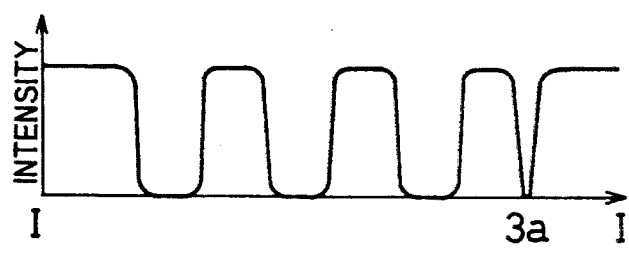
FIG. 11E
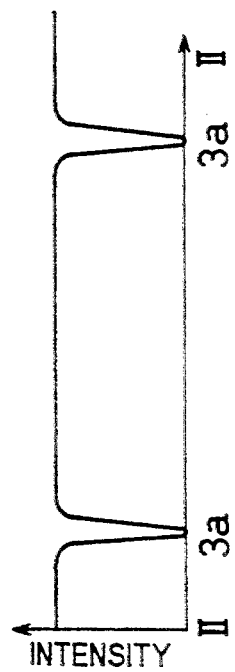

METHOD OF MANUFACTURING A PHOTOMASK

BACKGROUND OF THE INVENTION

1. Field of the Invention

The present invention relates to a method of manufacturing a photomask which is used in lithographic process during fabrication of a semiconductor device or the like.

2. Description of the Prior Art

A photomask for use in lithographic process in general includes a predetermined transfer pattern which consists of a portion transparent to illuminated light and a portion opaque to the illuminated light. The transfer pattern formed on the photomask is projected by a lens system onto a target substrate which includes a photosensitive material layer, and eventually transferred onto the photosensitive material layer.

FIG. 9A is a cross sectional view of a conventional photomask. On a transparent substrate 1 made of glass or other suitable material, light shielding regions 2 made of Cr, MoSi and the like are formed. A transfer pattern is formed by the light shielding regions 2.

In a projected image of such a photomask, as seen in FIG. 9B which shows the amplitude distribution of transmitted light, due to diffraction, light passed through the transparent substrate 1 floods into light shielding areas under the light shielding regions 2. Since an actual light intensity is a square of the amplitude, the distribution of the light intensity is as shown in FIG. 9C. Thus, in the conventional photomask, light is present in the light shielding areas which are created by the light shielding regions 2, which deteriorates the pattern transfer resolution and hence the transfer accuracy of fine patterns.

As a method of preventing such diffraction-induced deterioration in the resolution, the phase shift method is well known in the art. The phase shift method requires that transparent parts T1, T2 . . . and light shielding parts S1, S2, S3 . . . are alternately arranged in a photomask and that a phase shifting region 3 is disposed on every other transparent part as shown in FIG. 10A. That is, in the transparent part T2, the phase shifting region 3 is formed on the transparent substrate 1 between adjacent light shielding regions 2. The phase shifting regions 3 each have a thickness which gives rise to 180-degree phase difference between light therethrough and light passed through the transparent part not having a phase shifting region.

Hence, light passed through adjacent transparent parts and flooding under the light shielding part therebetween interfere and cancel each other. For instance, light passed through the transparent parts T1 and T2 and flooding under the light shielding part S2 cancel each other by interference therebetween under the light shielding part S2. This enhances the resolution of the photomask.

FIG. 11A is a plan view showing the photomask of FIG. 10A as modified in that three light shielding regions 2 of the same dimensions are arranged parallel to and equidistant from each other. FIG. 11B shows the distribution of the amplitude of light taken along the line I—I of FIG. 11A. FIG. 11C shows the distribution of the intensity of the light. FIG. 11D shows the distribution of the amplitude of light taken along the line II—II of FIG. 11A and FIG. 11E shows the distribution of the intensity of the light.

As obvious from FIGS. 11A to 11E, in this photomask, each phase shifting region 3 directly contacts the transparent substrate 1 at its periphery, i.e., a region 3a. A light beam through the phase shifting regions 3 is 180 degrees out of phase from a light beam through the transparent substrate 1 (FIGS. 11B and 11D), and therefore, the two transmitted light beams interfere and, cancel each other in the border region 3a. Hence, the light intensity at the border region 3a drops to zero as shown in FIGS. 11C and 11B.

Because of this, when the mask pattern of this photomask is transferred and developed on a photo resist layer which is disposed on a substrate-to-be-processed, if the photo resist layer 5 on the substrate-to-be-processed 4 is a positive type resist, residual resist as shown by the dash-and-dot line 6 in FIG. 12 will be created at a region in which the resist should be removed. Conversely, if the photo resist layer 5 is a negative type resist, the resist will be removed at a region in which it should remain. Hence, use of the phase shifting regions 3 as above is prohibited in some cases since a mask pattern for actual use in fabrication of a semiconductor device in general includes such isolated island-like shaped light shielding regions 2 as those shown in FIG. 11A.

SUMMARY OF THE INVENTION

A photomask according to a first aspect of the invention comprises: a transparent substrate; a light shielding region formed on a top major surface of the transparent substrate; a main phase shifting region formed on the top major surface of the transparent substrate and on one side of the light shielding region; and an auxiliary phase shifting region formed on the top major surface of the transparent substrate along the periphery of the main phase shifting region. The main phase shifting region is disposed on the top major surface in such a manner that light through the main phase shifting region is out of phase from light through the top major surface and cancel each other by interference therebetween. The auxiliary phase shifting region is disposed in such a relation to the top major surface and the main phase shifting region that a phase difference between light through the top major surface and light through the auxiliary phase shifting region and a phase difference between light through the auxiliary phase shifting region and light through the main phase shifting region are each smaller than the phase difference between light through the top major surface and light through the main phase shifting region.

In a second aspect of the present invention, the phase difference between light through the top major surface and light through the main phase shifting region is 180 degrees and the phase differences between light through the top major surface and light through the auxiliary phase shifting region and between light through the auxiliary phase shifting region and light through the main phase shifting region are each 90 degrees.

In the first aspect of the present invention, the light shielding region may include a plurality of light shielding regions which are arranged parallel to each other, and the one side of the light shielding region on which the main phase shifting region is formed on the outer side of the outermost one of the plurality of the light shielding regions.

In the first aspect of the present invention, the main phase shifting region may include a relatively deep first groove and the auxiliary phase shifting region includes a relatively shallow second groove which is shallower than the first groove.

In the first aspect of the present invention, the main phase shifting region may alternatively include a relatively thick first phase shifting film and the auxiliary phase shifting region includes a relatively thin second phase shifting film which is thinner than the first phase shifting film.

Further, at a border between the first and the second phase shifting films, edges of the first and the second phase shifting films are preferably not aligned to each other.

Alternatively in the first aspect of the present invention, at a border between the first and the second phase shifting films, edges of the first and the second phase shifting films may be aligned to each other.

The first phase shifting film may include a film made of an inorganic material.

In addition to this, the second phase shifting film may include a film made of an inorganic material.

In addition to this, the first and the second phase shifting films may be made of different materials.

The second phase shifting film may otherwise include a film made of an organic material.

The first phase shifting film may otherwise include a film made of an organic material.

In the first aspect of the present invention, the auxiliary phase shifting region may be formed by a plurality of auxiliary phase shifting parts which are disposed to encircle the main phase shifting region one farther than the other, in which case a phase difference between an outer auxiliary phase shifting part and the main phase shifting film is smaller than a phase difference between an inner auxiliary phase shifting part and the main phase shifting film.

Alternatively in the first aspect of the present invention, the light shielding region may include a plurality of light shielding regions which are arranged parallel to each other, in which case the one side of the light shielding region on which the main phase shifting region is formed on the outer side of the outermost one of the plurality of the light shielding regions.

Alternatively in the first aspect of the present invention, the plurality of the auxiliary phase shifting parts may include a plurality of grooves which are formed on the transparent substrate to encircle the main phase shifting region one farther than the other. An outer groove is shallower than an inner groove.

Alternatively in the first aspect of the present invention, the plurality of the auxiliary phase shifting parts may include a first and a second auxiliary phase shifting parts, in which case light through the first auxiliary phase shifting part is +120 degrees out of phase from light through the top major surface while light through the second auxiliary phase shifting part is +60 degrees out of phase from light through the top major surface.

Alternatively in the first aspect of the present invention, the main phase shifting region may include a relatively thick first phase shifting film and the auxiliary phase shifting parts include a plurality of relatively thin second phase shifting films which are thinner than the first phase shifting film. The plurality of the second phase shifting films are formed on the transparent substrate to encircle the main phase shifting region one farther than the other. The outer one of the second phase shifting films is thinner than an inner one of the second phase shifting films.

In addition to the above, the first phase shifting film may include a film made of an inorganic material.

Further, the second phase shifting films may include films made of an inorganic material.

Still further, the first and the second phase shifting films may be made of different materials.

Still further, the second phase shifting films may be made of different materials.

A fourth aspect of the present invention concerns a method of manufacturing a photomask. The method comprises the steps of: preparing a transparent substrate having a light shielding region on its top major surface; forming an auxiliary phase shifting region on the top major surface of the transparent substrate on one side of the light shielding region and in space from the light shielding region; and forming a main phase shifting region on the top major surface of the transparent substrate between the light shielding region and the auxiliary phase shifting region. The method is characterized in that: the main phase shifting region is disposed on the top major surface in such a manner that light through the main phase shifting region is out of phase from light through the top major surface and cancel each other by interference therebetween; and that the auxiliary phase shifting region is disposed in such a relation to the top major surface and the main phase shifting region that a phase difference between light through the top major surface and light through the auxiliary phase shifting region and a phase difference between light through the auxiliary phase shifting region and light through the main phase shifting region are each smaller than the phase difference between light through the top major surface and light through the main phase shifting region.

In the fourth aspect of the present invention, the step of forming the auxiliary phase shifting region preferably includes the step of forming a relatively thin first phase shifting film and the step of forming the main phase shifting region preferably includes the step of forming a relatively thick second phase shifting film which is thicker than the first phase shifting film.

In addition, the step of forming the second phase shifting film may include the step of forming the second phase shifting film such that edges of the first and the second phase shifting films are not aligned to each other at a border between the first and the second phase shifting films.

The step of forming the second phase shifting film may include the step of forming the second phase shifting film such that edges of the first and the second phase shifting films are aligned to each other at a border between the first and the second phase shifting films.

Preferably, the light shielding region includes a plurality of light shielding regions which are arranged parallel to each other, and the one side of the light shielding region on which the main phase shifting region is formed during formation of the second phase shifting film includes outer side of outermost one of the plurality of the light shielding regions.

Preferably, the first and the second phase shifting films are made of different materials.

Alternatively, the step of forming the auxiliary phase shifting region includes the step of forming a relatively shallow first groove, and the step of forming the main phase shifting region includes the step of forming a relatively deep second groove which is deeper than the first groove. The step of forming the first groove includes the steps of: forming a first resist film in an exposed region of the transparent substrate where the light shielding region is not provided so that the first resist film is formed in at least the exposed region of the transparent substrate where the first and the second grooves are not formed; and etching the transparent substrate through the first resist film by a predetermined depth which the first groove must have. The step of forming the second grooves includes the steps of: forming a second resist film at least on the first groove without processing the first resist film; and etching the transparent substrate through the second resist film by a predetermined depth which the second grooves must have.

Thus, according to the first aspect of the present invention, the main phase shifting region disposed on the one side of the light shielding region and the top major surface on the opposite side of the light shielding region are in such a positional relation which causes light beams through them to be out of phase from each other in such manner that they cancel each other by interference between them. Hence, light beams passed through the top major surface and the main phase shifting region and flooding into the back side of the light shielding region interfere and cancel each other, thereby enhancing the transfer accuracy at the edge portion of the light shielding region. On the other hand, the auxiliary phase shifting region is formed along the periphery of the main phase shifting region. A positional relation between the auxiliary phase shifting region and the top major surface and a positional relation between the auxiliary phase shifting region and the main phase shifting region are determined such that light beams passed through these regions and the top major surface respectively have smaller phase differences than the phase difference between the top major surface and the main phase shifting region. Hence, interference-induced cancelling of light beams at the border regions between the auxiliary phase shifting region and the top major surface and between the auxiliary phase shifting region and the main phase shifting region is largely reduced so that the interference would not deteriorate pattern transfer.

Further, a phase difference for example of 180 degrees is created between the main phase shifting region and the top major surface by disposing the relatively thick first phase shifting film while phase differences for example of 90 degrees are created between the auxiliary phase shifting region and the top major surface and between the auxiliary phase shifting region and the main phase shifting region by disposing the relatively thin second phase shifting film which is thinner than the first phase shifting film. Hence, it is possible to restrain cancelling of light beams at the border regions between the auxiliary phase shifting region and the top major surface and between the auxiliary phase shifting region and the main phase shifting region.

By disposing the first and the second phase shifting films so that they overlap, aligning of the first and the second phase shifting films is made easier.

According to the second aspect of the present invention, since light through the main phase shifting film is 180 degrees out of phase from light through the top major surface, light beams passed through the top major surface and the main phase shifting region and flooding into the back side of the light shielding region are most effectively prevented from interfering and hence cancelling each other. Light through the auxiliary phase shifting film is 90 degrees out of phase from light through the top major surface, and light through the auxiliary phase shifting region is also 90 degree out of phase from light passed through the main phase shifting region. Hence, light beams immediately below the border regions between the auxiliary phase shifting region and the top major surface and between the auxiliary phase shifting region and the main phase shifting region are most effectively prevented from interfering and hence cancelling each other.

According to the third aspect of the present invention, a plurality of auxiliary phase shifting parts are disposed to encircle the main phase shifting region in such a manner that a phase difference between an outer auxiliary phase shifting part and the main phase shifting film is smaller than a phase difference between an inner auxiliary phase shifting part and the main phase shifting film. Hence, at the border regions between the main phase shifting film and the auxiliary phase shifting part next to the same and between adjacent auxiliary phase shifting parts, and further between the top major surface and the auxiliary phase shifting part, phase differences are reduced, thereby effectively preventing light beams from interfering and hence cancelling each other at these border regions.

According to the fourth aspect of the present invention, the auxiliary phase shifting region are formed to ensure that a phase difference between light through the top major surface and light through the auxiliary phase shifting region and a phase difference between light through the auxiliary phase shifting region and light through the main phase shifting region are each smaller than the phase difference between light through the top major surface and light through the main phase shifting region. Hence, interference-induced cancelling of light beams at the border regions between the auxiliary phase shifting region and the top major surface and between the auxiliary phase shifting region and the main phase shifting region is largely reduced so that the interference would not deteriorate pattern transfer.

According to the fourth aspect of the present invention, it is easy to manufacture a photomask in which light beams immediately below the border regions between the auxiliary phase shifting region and the top major surface and between the auxiliary phase shifting region and the main phase shifting region are most effectively prevented from interfering and hence cancelling each other. This is because a phase difference for example of 180 degrees is created between the main phase shifting region and the top major surface by disposing the relatively thick first phase shifting film while phase differences for example of 90 degrees are created between the auxiliary phase shifting region and the top major surface and between the auxiliary phase shifting region and the main phase shifting region by disposing the relatively thin second phase shifting film which is thinner than the first phase shifting film.

According to the fourth aspect of the present invention, in addition to this, by disposing the first and the second phase shifting films so that they overlap, aligning of the first and the second phase shifting films is made easier.

Accordingly, it is an object of the present invention to offer a photomask with which a mask pattern is transferred at a high resolution regardless of the configuration of a light shielding region. The invention is also aimed at offering a manufacturing method of such a photomask.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 10A to 10C are explanatory diagrams showing the effect of other conventional photomask;

FIG. 11A is a diagram of a photomask as viewed from above and FIGS. 11B to 11D are diagrams showing the amplitude and the intensity of light below the photomask;

DESCRIPTION OF THE PREFERRED EMBODIMENTS

Figure 1A:
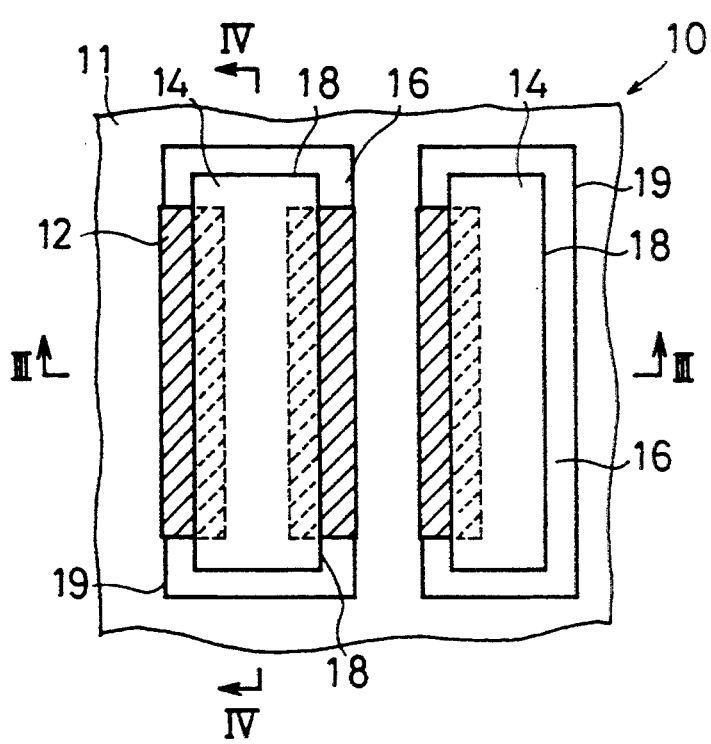
FIG. 1A is a diagram of a photomask according to a first preferred embodiment of the present invention as viewed from above and FIGS. 1B and 1C are diagrams showing the intensity of light below the photomask.
Figure 2:
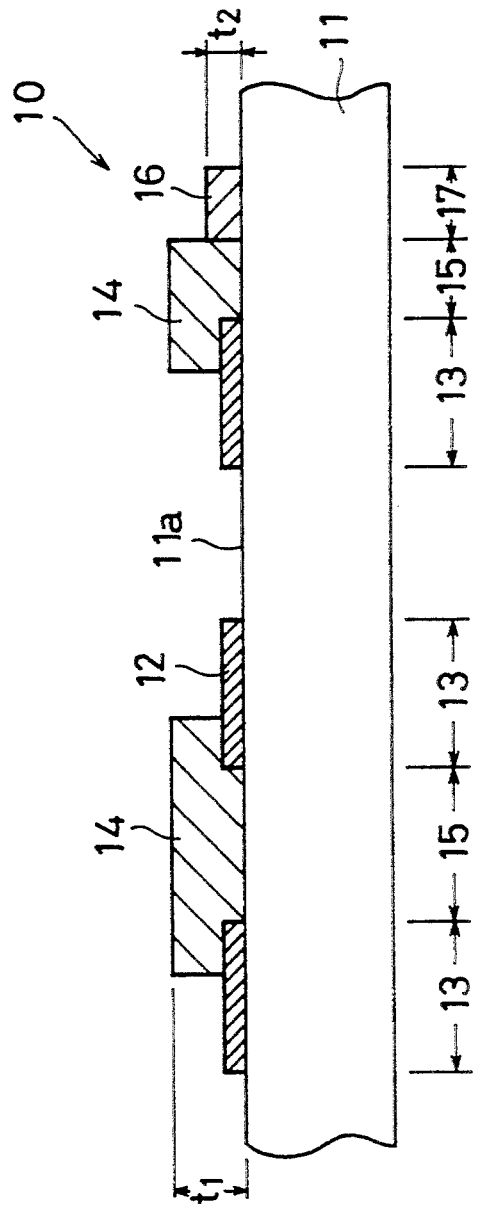
FIG. 2 is a cross sectional view of the photomask of FIG. 1A.

FIG. 1A is a plan view of a photomask according to a first preferred embodiment of the present invention. FIG. 2 is a cross sectional view of FIG. 1A taken along the line III—III of FIG. 1A.

As shown in FIGS. 1A and 2, in a photomask 10, light shielding members 12 made of Cr, MoSi and the like are disposed on a major surface 11a of a transparent substrate 11. A plurality of light shielding regions 13 are formed by the light shielding members 12.

In every other region between adjacent light shielding members 12 on the major surface 11a of the transparent substrate 11, a main phase shifting film 14 is disposed along the direction in which the light shielding members 12 are arranged. The main phase shifting film 14 are made of inorganic material such as $SiO_2$, $Si_3N_4$ and $CaF_2$ or alternatively of organic material such as poly methyl methacrylate. Main phase shifting regions 15 are formed by the main phase shifting films 14. As viewed from each light shielding region 13, of the two opposite sides of the light shielding member 12 on the major surface 11a of the transparent substrate 11, one side is occupied by the main phase shifting film 14 which forms the main light shielding region 15.

The main phase shifting films 14 each have a thickness which causes that light therethrough is +180 degrees out of phase from light not therethrough. For example, the thickness $t_1$ of the main phase shifting films 14 is determined to satisfy:

$$t_1 = \frac{\lambda}{2(n_1 - 1)} \quad (1)$$

where $\lambda$ is the wavelength of illuminated light and $n_1$ is the refractive index of the main phase shifting films 14.

On the major surface 11a of the transparent substrate 11 and along the peripheries of the main phase shifting films 14, auxiliary phase shifting films 16 are disposed which are made of inorganic material such as $SiO_2$, $Si_3N_4$ and $CaF_2$ or alternatively of organic material such as poly methyl methacrylate. The auxiliary phase shifting films 16 form auxiliary phase shifting regions 17.

The auxiliary phase shifting films 16 each have a thickness which causes light therethrough to be +90 degrees out of phase from light not therethrough. For example, the thickness $t_2$ of the auxiliary phase shifting films 16 is determined to satisfy:

$$t_2 = \frac{\lambda}{4(n_2 - 1)} \quad (2)$$

where $n_2$ is the refractive index of the auxiliary phase shifting films 16.

Hence, light transmitted by the main light shielding region 15 is +180 degrees out of phase from light passed through the major surface 11a. On the other hand, light transmitted by the main light shielding region 15 is +90 degrees out of phase from light transmitted by the auxiliary phase shifting regions 17. Likewise, light transmitted by the auxiliary phase shifting regions 17 is +90 degrees out of phase from light passed through the major surface 11a.

Now, the intensity of two light beams +90 degrees out of phase from each other and interfering with each other is briefly discussed.

In general, if the two light beams $U_1$ and $U_2$ having 90-degree phase difference therebetween satisfy:

$$U_1 = a_1 \cdot \sin(\omega t + \theta_1)$$
$$U_2 = a_2 \cdot \sin(\omega t + \theta_2) \quad (3)$$

a composite profile U is:

$$U = U_1 + U_2 = a \cdot \sin(\omega t + \theta) \quad (4)$$
$$a = a_1^2 + a_2^2 + 2a_1 a_2 \cdot \cos(\theta_1 - \theta_2)$$
$$\tan\theta = \frac{a_1 \cdot \cos\theta_1 + a_2 \cdot \sin\theta_2}{a_1 \cdot \cos\theta_1 + a_1 \cdot \cos\theta_2}$$

Different from this, if the two light beams $U_1$ and $U_2$ have the same phase ($\theta 1 = \theta 2 = 0$) and the same amplitude (a1=a2=0.5), the light beams are expressed as:

$$U_1 = U_2 = 0.5 \sin \omega t \quad (5)$$

From Eq. 4, a composite profile U is therefore:

$$U = \sin \omega t \quad (6)$$

Figure 3:
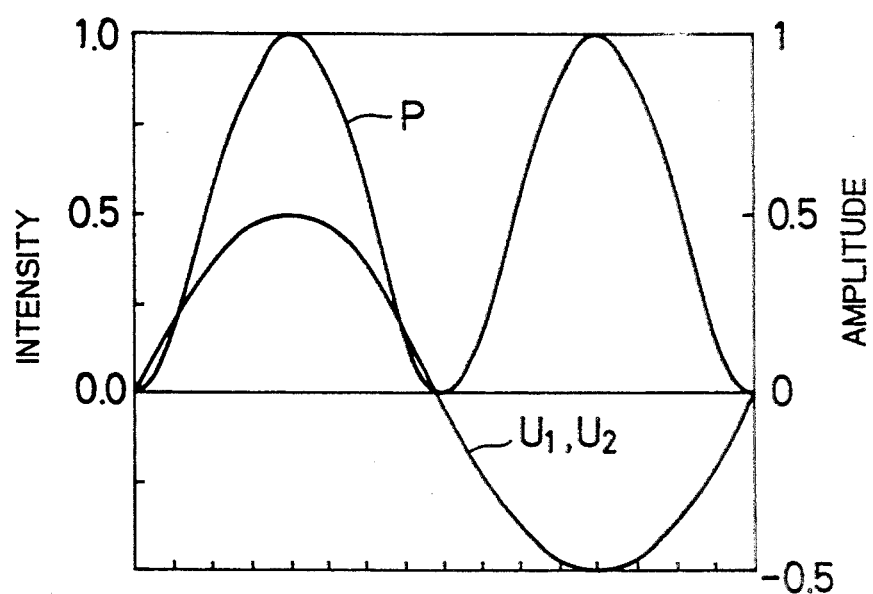
FIG. 3 is a diagram showing the waveforms of the amplitude and the interference intensity of two light beams having the same phase.

Since the intensity of a light beam composed by the two light beams is a square of the composite profile U, the composite light beam has a waveform P as that shown in FIG. 3. As readily seen in FIG. 3, the intensity of the light beam composed by the two light beams is 1.

Figure 4:
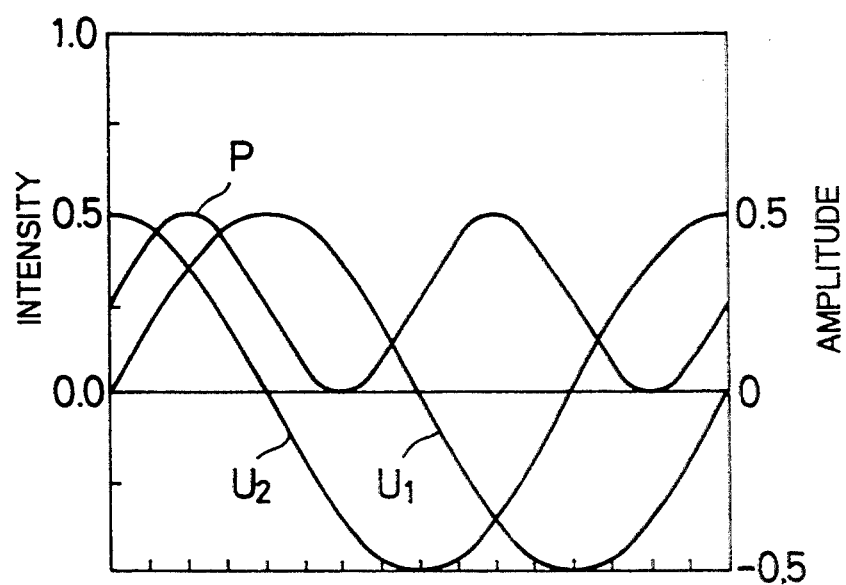
FIG. 4 is a diagram showing the waveforms of the amplitude and the interference intensity of two light beams having 90-degree phase difference therebetween.
Figure 5:
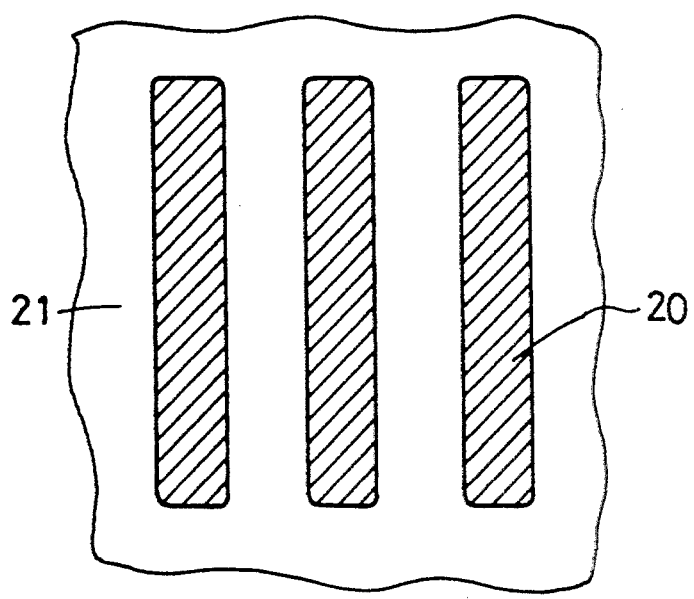
FIG. 5 is a diagram showing a transferred pattern obtainable when a photo resist layer is a negative type resist.

Next, interference between two light beams $U_1$ and $U_2$ 90 degrees out of from each other ($\theta 1 = 0$, $\theta 2 = 90$ degrees) is discussed (FIG. 4). Assuming that the two light beams $U_1$ and $U_2$ have the same amplitude, i.e., $a1 = a2 = 0.5$, the two light beams $U_1$ and $U_2$ are:

$$\begin{aligned} U_1 &= 0.5 \sin \omega t \\ U_2 &= 0.5 \sin(\omega t + 90°) \end{aligned} \quad (7)$$

Hence, from Eq. 4, the composite profile U is:

$$U = 0.5 \sin(\omega t + 45°) \quad (8)$$

As mentioned above, since the intensity of a composite light beam is a square of the composite profile U, the composite light beam has a waveform P as that shown in FIG. 4. Thus, the intensity of the composite light beam is 0.5, a half of the intensity of where the two light beams do not have a phase difference therebetween.

With this in mind, description will be made on how a mask pattern is transferred onto a photo resist layer disposed on a substrate-to-be-processed using the photomask 10 of the present embodiment.

The photomask 10 causes 180-degree phase difference between light passed through the main light shielding region 15 which is on one side of the light shielding region 13 and light passed through the major surface 11a which is on the opposite side of the light shielding region 13. Hence, due to the phase shifting principle described with FIGS. 10A to 10C, a high resolution is obtained especially at an edge region of the light shielding region 13.

At the same time, at a border region 18 between the main phase shifting film 14 and the auxiliary phase shifting film 16 and at a border region 19 between the auxiliary phase shifting film 16 and the major surface 11a, light through the sides of the border regions becomes 90 degrees out of phase from each other. Hence, due to the phase shifting principle, the light intensity drops by half.

Figure 1C:
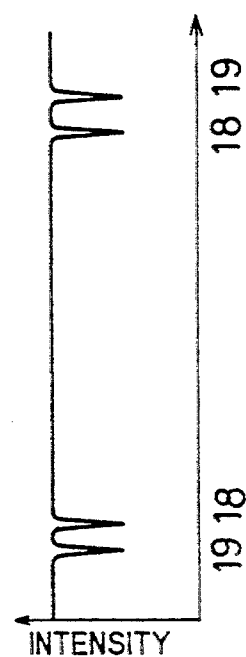
Figure 1B:
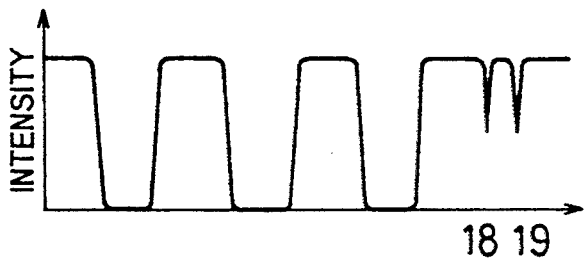

FIG. 1B depicts the distribution of the light intensity taken along the line III—III of FIG. 1A. FIG. 1C depicts the distribution of the light intensity taken along the line IV—IV of FIG. 1A.

FIGS. 1B and 1C clearly show that the border regions 18 and 19 serve substantially as the transparent regions during pattern transfer since light intensity, though decreases, would not become zero at the border regions 18 and 19. Hence, if the photo resist layer on the substrate-to-be-processed is a positive type resist, prevention of residual resist in regions corresponding to the border regions is successfully achieved. If the photo resist layer is a negative type resist, the meritorious effect is prevention of unwanted removal of the resist on a photo resist layer 21 disposed on a substrate-to-be-processed 20 at regions corresponding to the border regions 18 and 19.

Thus, despite the isolated island-like arrangement of the light shielding members 12, high-resolution transfer of the mask pattern is made possible.

Figure 6:
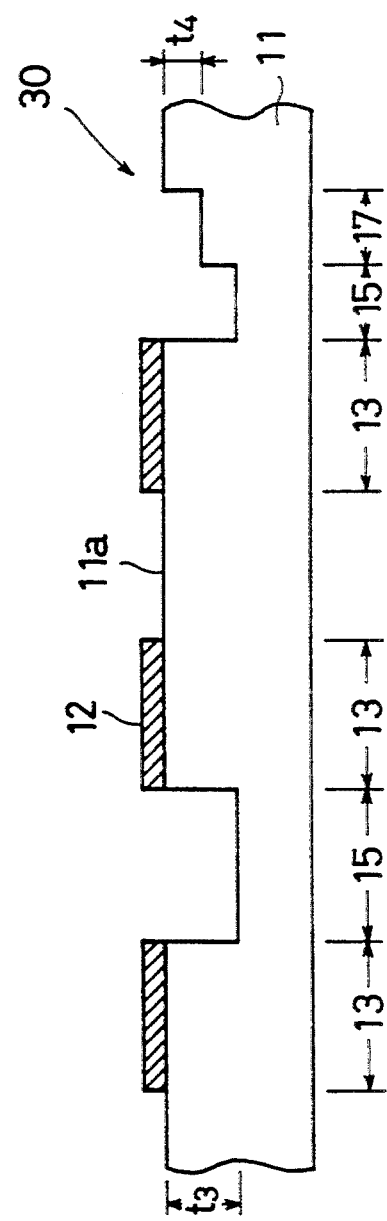
FIG. 6 is a cross sectional view of a photomask according to a second preferred embodiment of the present invention.

FIG. 6 is a cross sectional view of a photomask according to a second preferred embodiment of the present invention. FIG. 6 corresponds to the cross sectional view of FIG. 1A taken along the line III—III.

In a photomask 30, the main phase shifting regions 15 and the auxiliary phase shifting regions 17 are formed not by means of the main phase shifting films 14 and the auxiliary phase shifting films 16 of the first preferred embodiment, but by locally reducing the thickness of the transparent substrate 11 by etching. Needless to mention, the main phase shifting regions 15 and the auxiliary phase shifting regions 17 are disposed on the major surface 11a in a similar positional relation to that in the first preferred embodiment.

More precisely, in the main phase shifting regions 15, the transparent substrate 11 is etched to a depth $t_3$ so that light through the main phase shifting regions 15 is +180 degrees out of phase from light passed through the major surface 11a. For example, the depth $t_3$ is set as:

$$t_3 = \frac{\lambda}{2(n_3 - 1)} \quad (9)$$

where $n_3$ is the refractive index of the transparent substrate 11.

On the other hand, the transparent substrate 11 is etched to a depth $t_4$ in the auxiliary phase shifting regions 17 so that light through the auxiliary phase shifting regions 17 is +90 degrees out of phase from light passed through the major surface 11a. That is, $$t_4 = \frac{\lambda}{4(n_3 - 1)} \quad (10)$$

The photomask 30 is otherwise the same as the photomask of the first preferred embodiment, and therefore, the symbols and the reference numbers used in the first preferred embodiment are allotted to the corresponding parts, by which the other structure of the photomask 30 is regarded as explained. Effects promised by use of the photomask 30 are similar to those attainable in the first preferred embodiment.

The foregoing has described the first preferred embodiment (FIGS. 1A, 1B, 1C and 2) and the second preferred embodiment (FIG. 6) as requiring that the thickness $t_1$ of the main phase shifting films 14 and the depth $t_3$ by which the transparent substrate 11 is etched are determined so as to create 180-degree phase difference between light through the main phase shifting regions 15 and light through the major surface 11a. However, the phase difference is not necessarily limited to 180 degrees. Rather, a requirement here is that the thickness $t_1$ of the main phase shifting films 14 and the depth $t_3$ by which the transparent substrate 11 is etched are determined so as to cause such a phase difference because of which light through the main phase shifting regions 15 and light through the major surface 11a interfere and cancel each other. Similarly, although the foregoing has also described that the thickness $t_2$ of the auxiliary phase shifting films 16 and the depth $t_4$ by which the transparent substrate 11 is etched are determined such that light through the auxiliary phase shifting regions 17 is +90 degrees out of phase from both light through the major surface 11a and light transmitted by the main light shielding regions 15, the phase difference is not necessarily 90 degrees. It is only necessary that the thickness $t_2$ of the auxiliary phase shifting films 16 and the depth $t_4$ by which the transparent substrate 11 is etched are determined so as to ensure that the phase difference between light through the auxiliary phase shifting regions 17 and the major surface 11a and the phase difference between light through the auxiliary phase shifting regions 17 and the main light shielding region 15 are both approximately half the phase difference between light through the main light shielding regions 15 and the major surface 11a.

Figure 7:
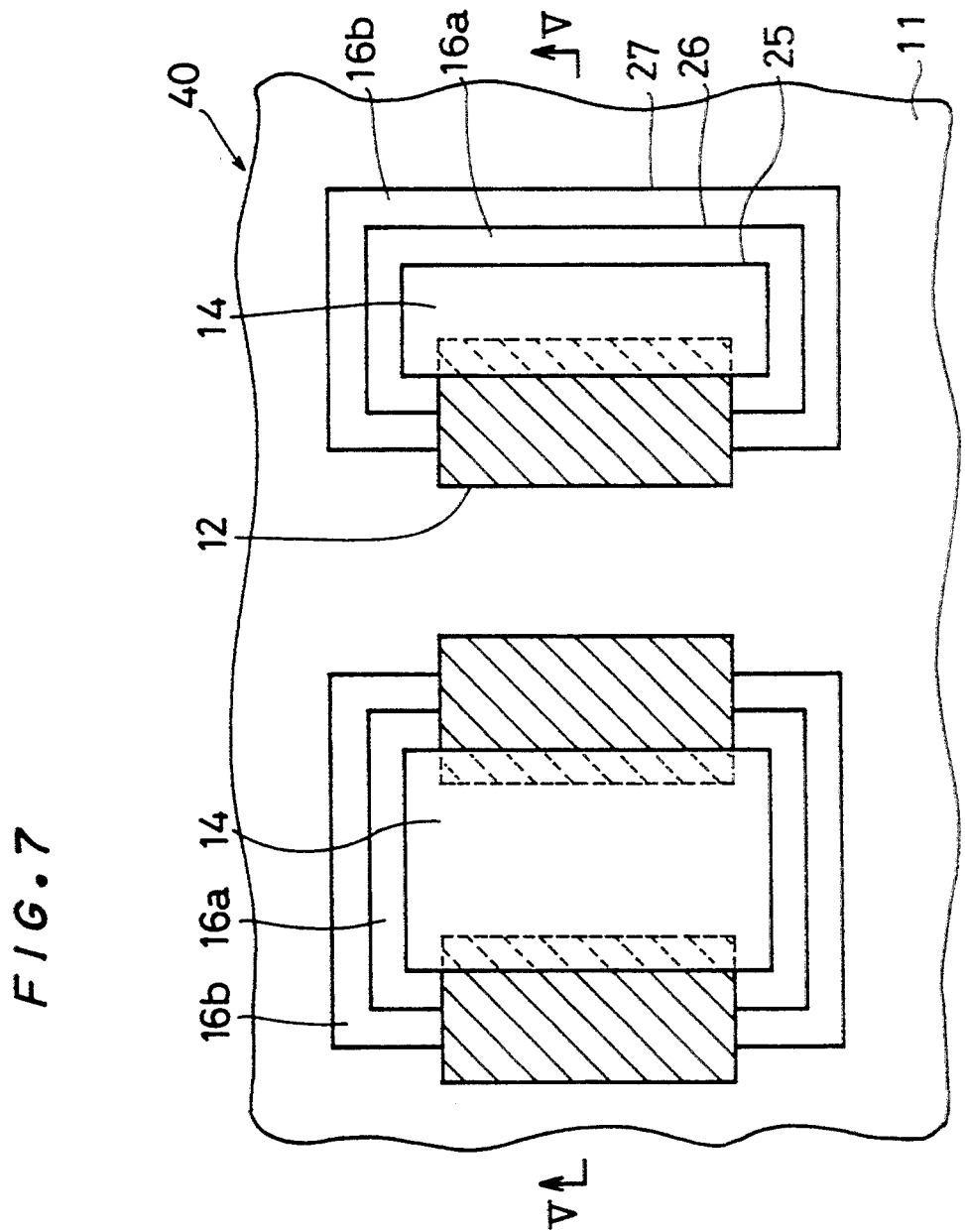
FIG. 7 is a plan view of a photomask according to a third preferred embodiment of the present invention.
Figure 8:
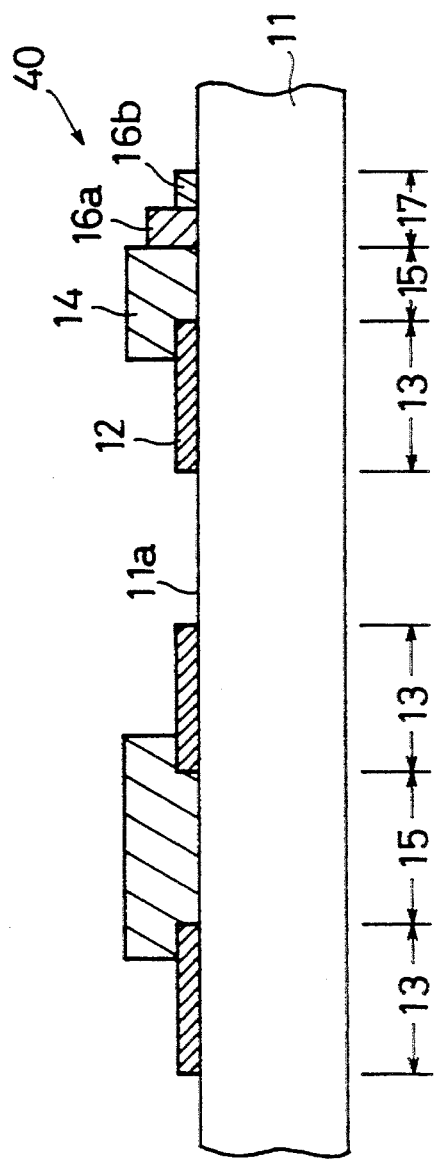
FIG. 8 is a cross sectional view taken along the line V—V of FIG. 7.
Figure 9A:
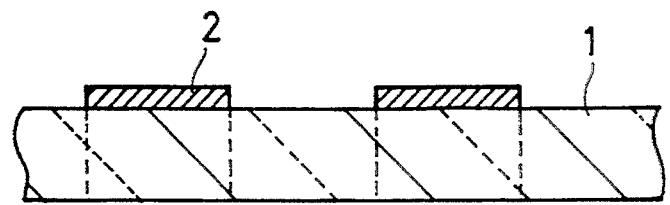
FIGS. 9A to 9C are explanatory diagrams showing the effect of a conventional photomask.
Figure 9B:
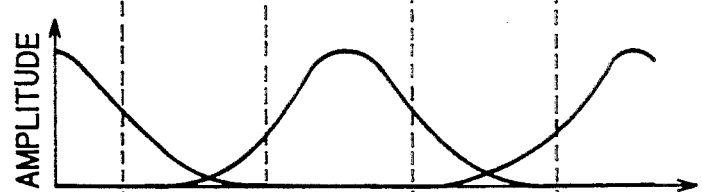
Figure 9C:
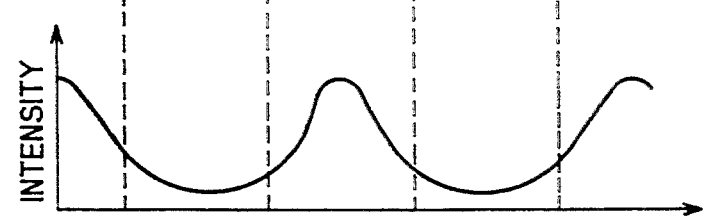
Figure 12:
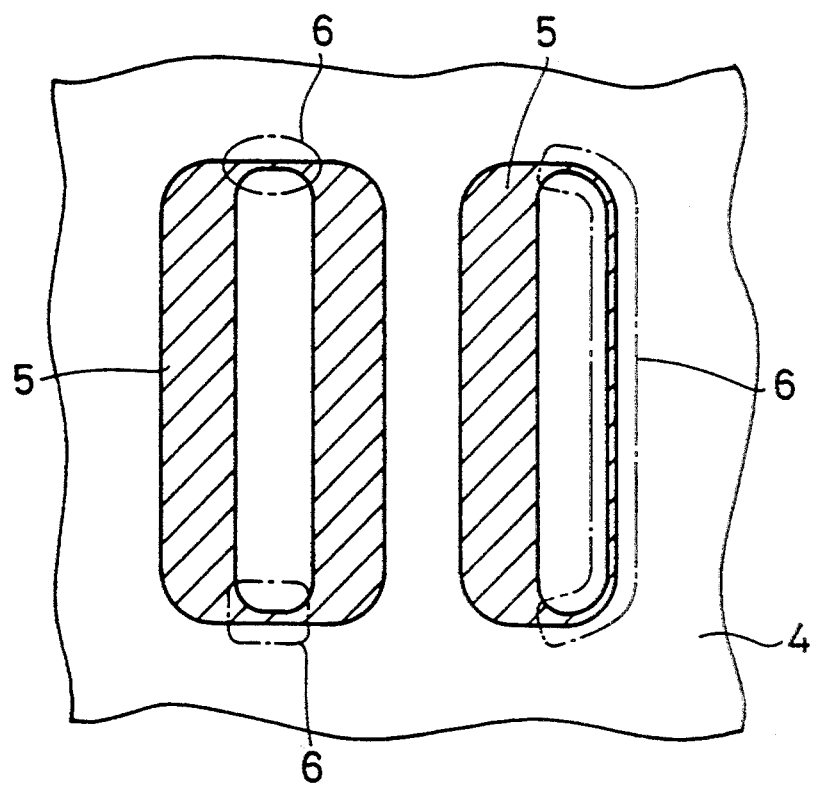
FIG. 12 is a diagram showing a defect of the conventional photomasks.

FIG. 7 a plan view of a photomask according to a third preferred embodiment of the present invention. FIG. 8 is a cross sectional view of FIG. 7 taken along the line V—V of FIG. 7.

In a photomask 40, two different types of auxiliary phase shifting films 16a and 16b are disposed on the periphery of each main phase shifting film 14 (FIGS. 7 and 8). Thus, the auxiliary phase shifting regions 17 are formed by the two different types of auxiliary phase shifting films 16a and 16b. Similarly to the first and the second preferred embodiments, the thickness of the main phase shifting films 14 is determined so that light through the main phase shifting films 14 is +180 degrees out of phase from light through the major surface 11a. The thicknesses of the auxiliary phase shifting films 16a and 16b are determined so that light through the auxiliary phase shifting films 16a and 16b are respectively +120 degrees and +60 degrees out of phase from light through the major surface 11a. The photomask 40 is otherwise the same as the photomask of the first preferred embodiment, and therefore, the symbols and the reference numbers used in the first preferred embodiment are allotted to the corresponding parts, by which the other structure of the photomask 30 is regarded as explained.

In the photomask 40, at border regions 25 between the main phase shifting films 14 and the auxiliary phase shifting film 16a, border regions 26 between the auxiliary phase shifting films 16a and 16b and at border regions 27 between the auxiliary phase shifting films 16b and the major surface 11a, light through the sides of the border regions becomes 60 degrees out of phase from each other. Hence, compared to where a 90-degree phase difference is created at the border regions as in the first and the second preferred embodiments, drop in the light intensity at the border regions 25 to 27 is better restrained, which further enhances the pattern transfer accuracy.

Although the foregoing has described that the auxiliary phase shifting regions 17 are formed by the two different types of auxiliary phase shifting films 16a and 16b in the third preferred embodiment (FIGS. 7 and 8), the auxiliary phase shifting regions 17 may be formed by three or more different types of auxiliary phase shifting films which are disposed to encircle the main phase shifting film 14 one farther than the other. In this case, it is necessary to ensure that a phase difference between an outer auxiliary phase shifting film and the main phase shifting film 14 is smaller than a phase difference between an inner auxiliary phase shifting film and the main phase shifting film 14. Phase differences between adjacent phase shifting films become smaller where a greater number of the auxiliary phase shifting films are provided, and, therefore, by disposing an increased number of the auxiliary phase shifting films, even better pattern transfer accuracy is possible.

Figure 40:
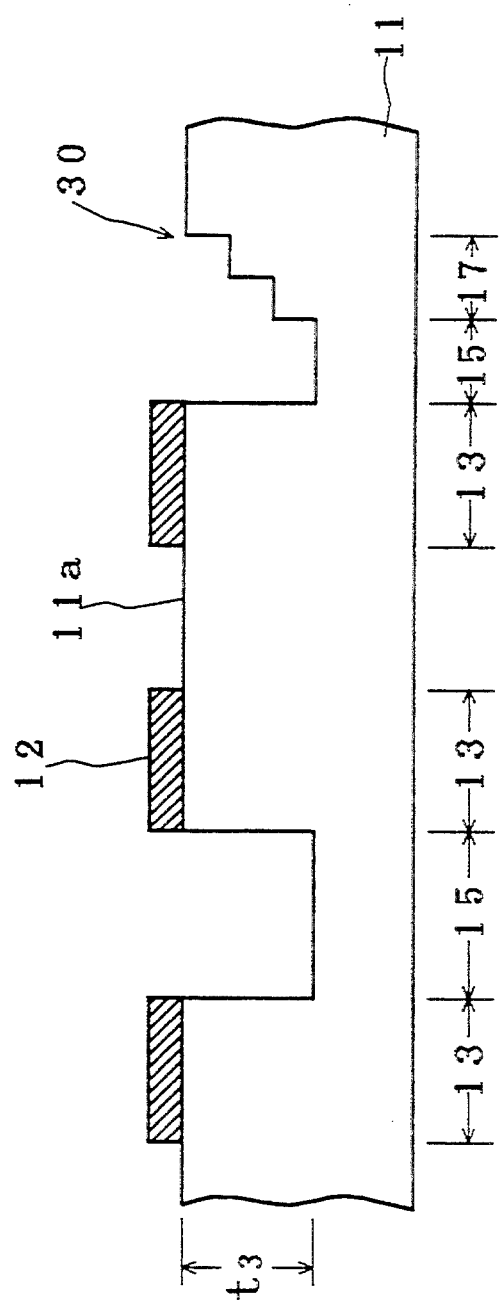
FIG. 40 is a cross sectional view of a photomask according to a fourth preferred embodiment of the present invention.

The foregoing has also described that the main light shielding regions 15 and the auxiliary phase shifting regions 17 are formed by disposing the phase shifting films 14, 16a and 16b on the major surface 11a in the third preferred embodiment. However, similarly to the second preferred embodiment (FIG. 6), the main light shielding regions 15 and the auxiliary phase shifting regions 17 may be formed by selectively etching the transparent substrate 11 (See FIG. 40).

As to the thicknesses of the auxiliary phase shifting films 16a and 16b, although the third preferred embodiment requires that the thicknesses are determined so that 120-degree and 60-degree phase differences are created between the auxiliary phase shifting films 16a and 16b and the major surface 11a, this does not limit the invention in any sense. What is important here is only to ensure a phase difference between an outer auxiliary phase shifting film and the main phase shifting film 14 is smaller than a phase difference between an inner auxiliary phase shifting film and the main phase shifting film 14.

Since the photomasks according to the present invention enables accurate pattern transfer even when a mask pattern is formed by isolated island-like arrangement of light shielding regions, effective applications of the invention involve clement isolation regions or charge accumulating electrodes of 64 M-byte DRAM and other semiconductor devices. The invention is also effective in forming wire electrodes. Nevertheless, it is intended that the invention can be employed in fabrication of various other types of electronic devices such as liquid crystal displays.

Next, a method of manufacturing of the photomasks as heretofore described.

Figure 13:
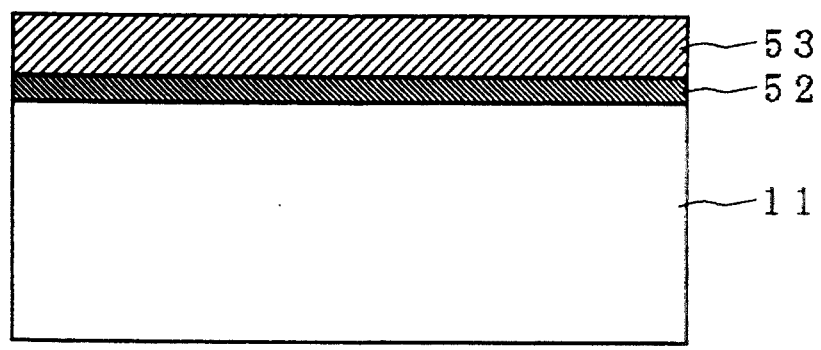
FIGS. 13 to 29 are cross sectional views showing the photomask of the first preferred embodiment during fabrication.

FIGS. 13 to 26 are cross sectional views showing the photomask 10 of the first preferred embodiment (FIG. 2) as it is during fabrication steps taken along the line III—III of FIG. 1A. As shown in FIG. 13, first, a light shielding film 52 made of Cr is formed on the transparent substrate 11 made of SiO$_2$ (quartz glass), for example (First step).

Figure 14:
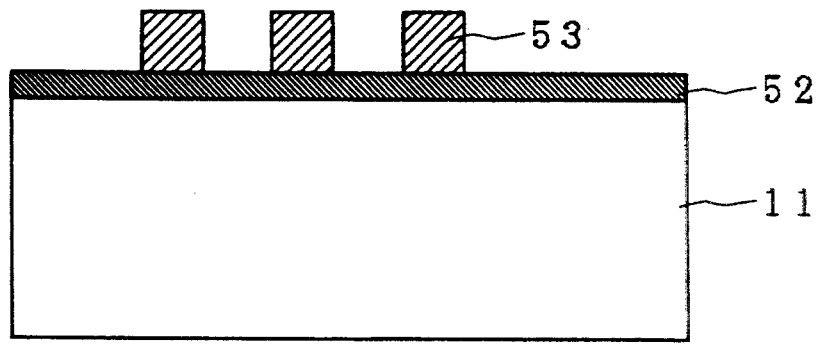
Figure 15:
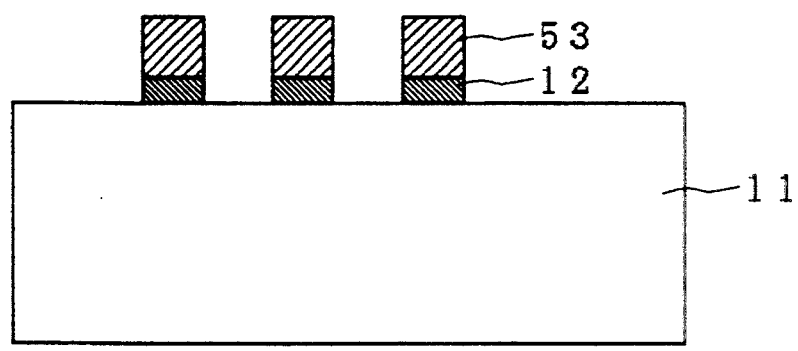
Figure 16:
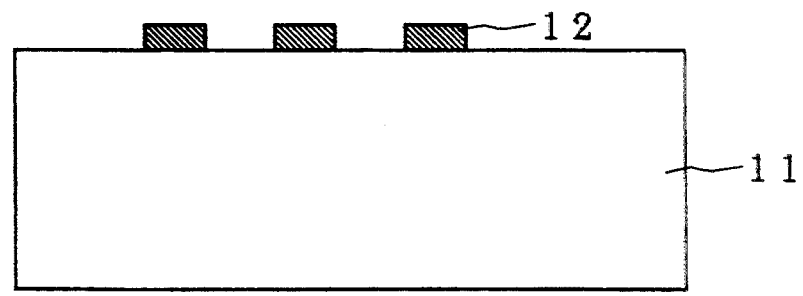

Following this, a resist layer 53 disposed on the light shielding film 52 is selectively removed by E-beam exposure as shown in FIG. 14, patterning the resist layer 53 into a configuration which corresponds to a light shielding pattern. The light shielding film 52 is then selectively etched through the resist layer 53 as shown in FIG. 15, followed by removal of the resist layer 53 as shown in FIG. 16 (Second step).

Figure 17:
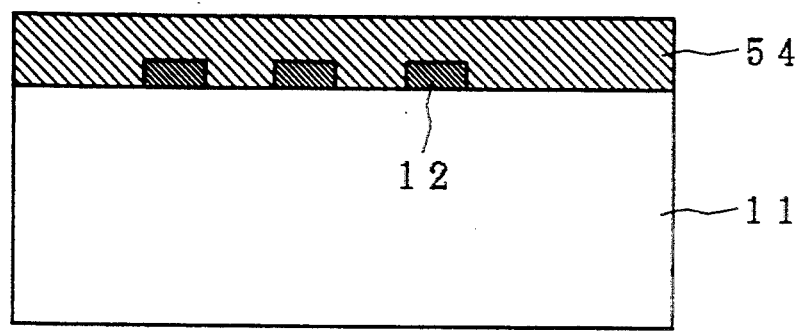
Figure 18:
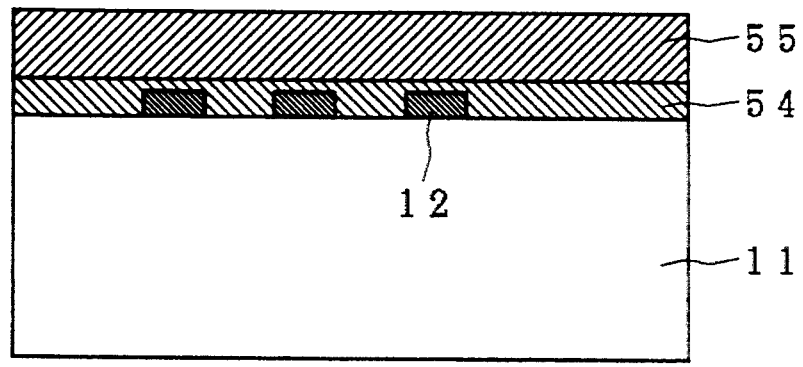
Figure 19:
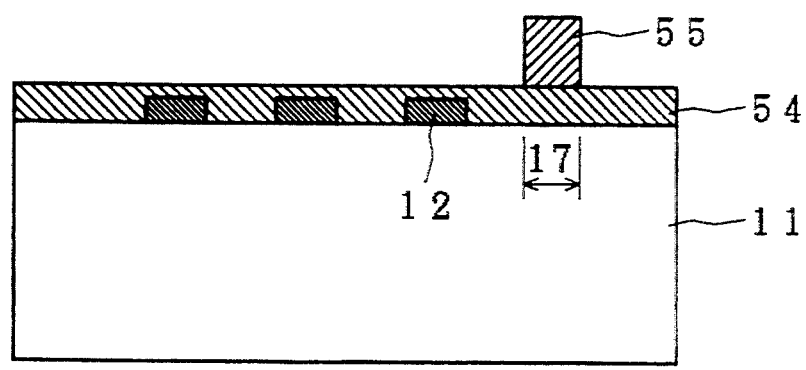
Figure 20:
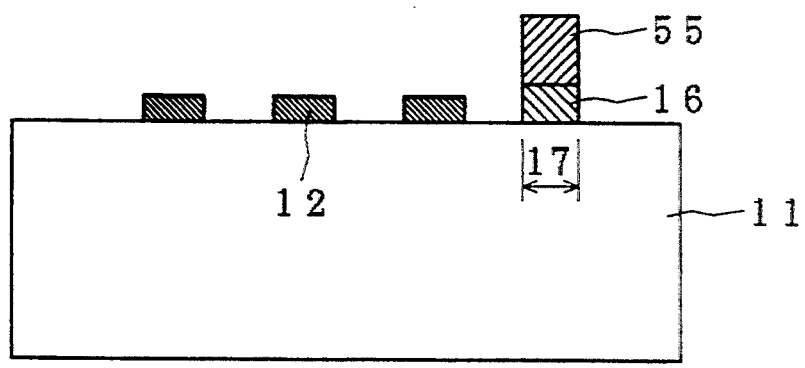
Figure 21:
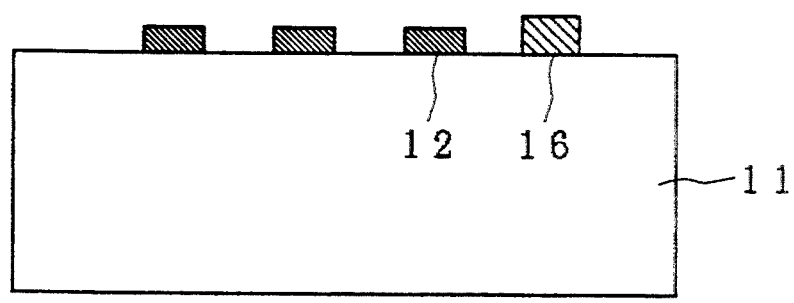
Figure 22:
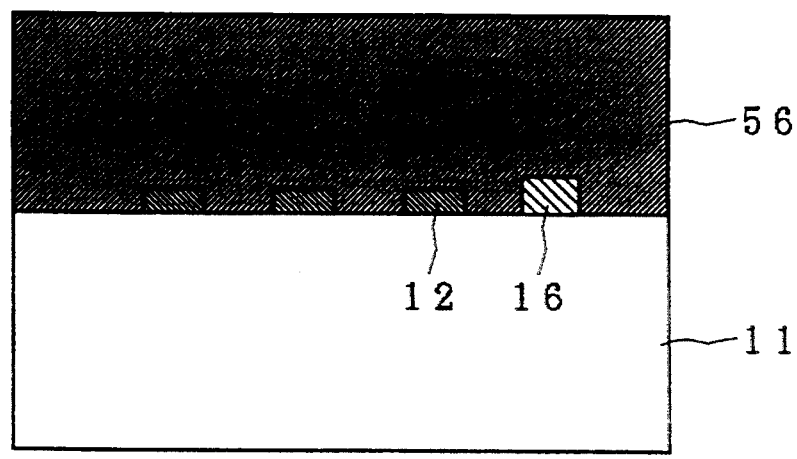

Next, as shown in FIG. 17, the photomask is entirely covered with a film 54 for forming the auxiliary phase shifting films. A resist layer 55 is then formed (FIG. 18) and resist patterns are defined only in regions which correspond to the auxiliary phase shifting regions 17 by E-beam exposure (FIG. 19). The film 54 is then etched through the resist patterns 55, thereby forming the auxiliary phase shifting regions 17 (FIG. 20). The resist patterns are removed as shown in FIG. 21 and the photomask is entirely coated with a film 56 for forming the main phase shifting films as shown in FIG. 22.

Figure 23:
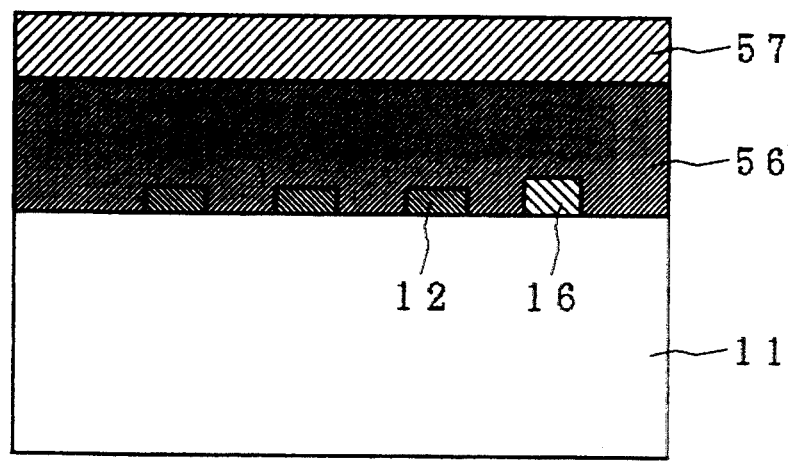
Figure 24:
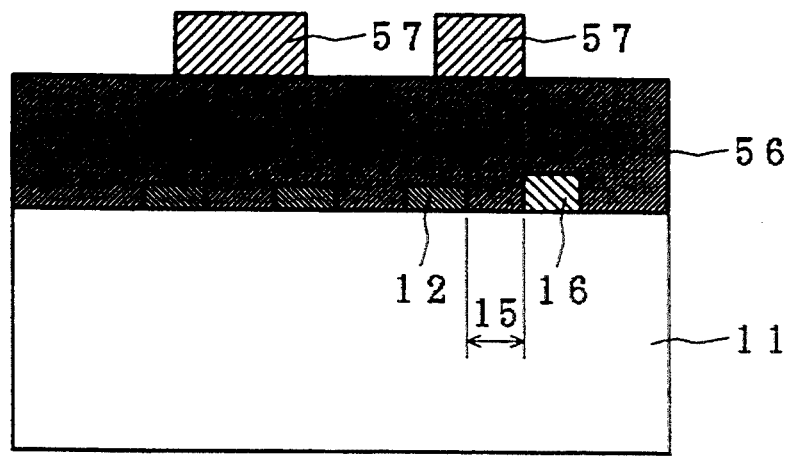

A resist layer 57 is then disposed as shown in FIG. 23. By E-beam exposure, the resist layer 57 is patterned into resist patterns 57 which corresponds to the main light shielding regions 15 as shown in FIG. 24. Though the resist patterns 57 may lie above the light shielding members 12, the edges of the auxiliary phase shifting films 16 must be approximately aligned to the edges of the resist patterns 57.

The film 56 is etched through the resist patterns 57, thereby forming the main phase shifting regions 14

Figure 25:
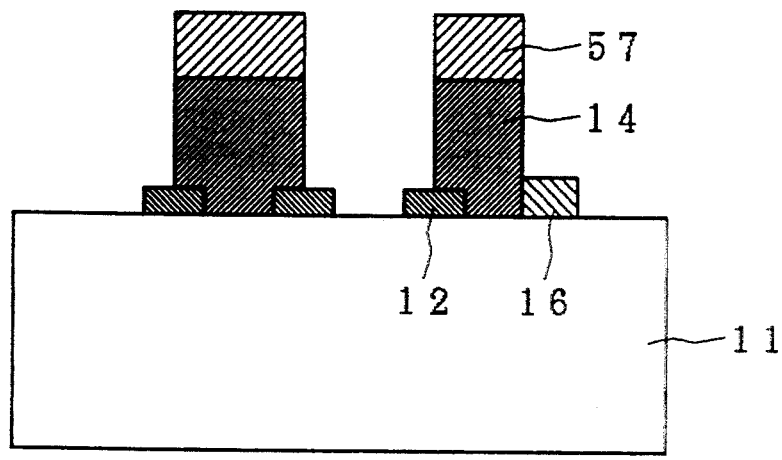
Figure 26:
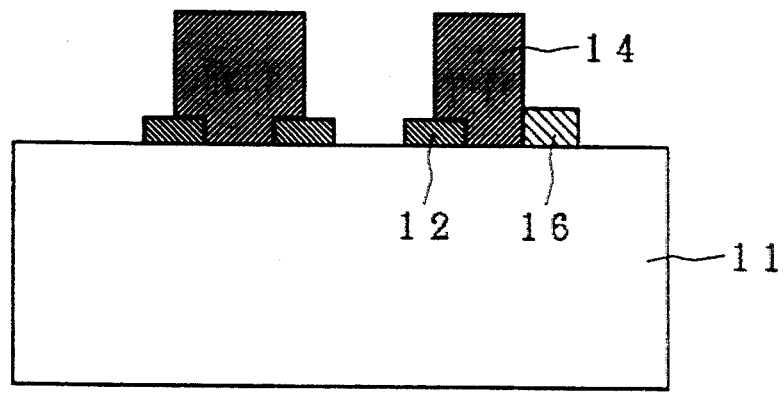

(FIG. 25). At last, the resist layer is removed, completing the photomask 10 (FIG. 26).

During the etching step from FIGS. 24 to 25, the film 56 for forming the main phase shifting films 14 alone should be etched and the auxiliary phase shifting films 16 must remain unetched. To this end, the main phase shifting regions 14 are made of silicon nitride film $Si_3N_4$ ($Si_xN_x$) and the auxiliary phase shifting films 16 are made of spin on glass (SOG), for example. The combination of the materials for the main phase shifting regions 14 and the auxiliary phase shifting films 16 may be opposite to this. Any other combinations as far as ensuring selective etching can be adopted in the fabrication steps described above.

Figure 27:
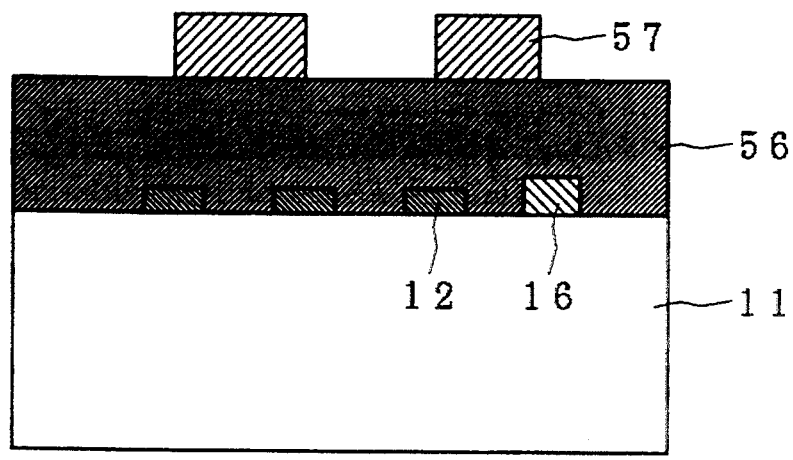
Figure 28:
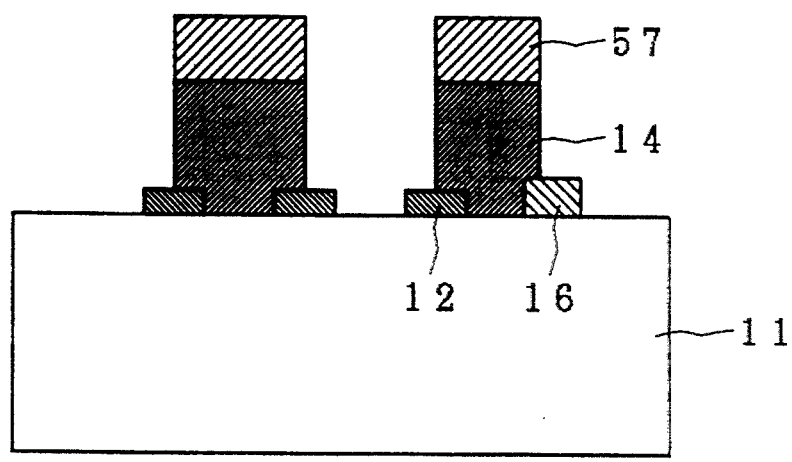
Figure 29:
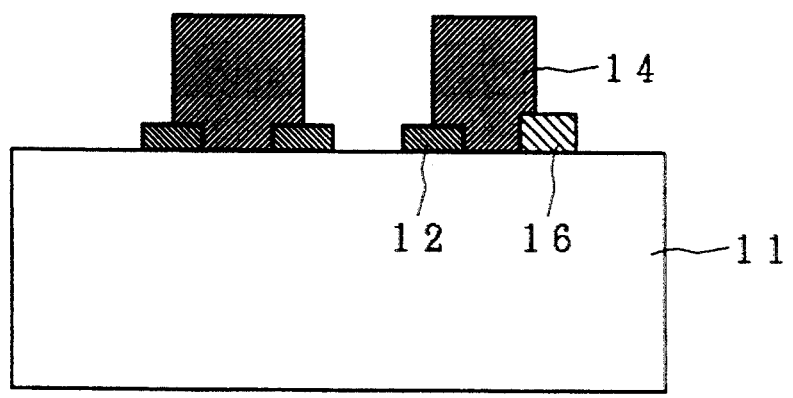

Although the manufacturing method above requires that the main phase shifting regions 14 and the auxiliary phase shifting films 16 do not overlap each other, larger resist patterns 57 overlying the auxiliary phase shifting films 16 may be used as shown in FIG. 27, in which case the main phase shifting regions 14 as they are obtainable by etching the film 56 lie over the auxiliary phase shifting films 16 (FIG. 28). The resist patterns are then removed to complete the photomask as that shown in FIG. 29. Since the main phase shifting regions 14 are allowed to lie over the auxiliary phase shifting films 16, the resist patterns 57 may be formed with a less strict location tolerance, which makes the fabrication easier.

FIGS. 30 to 37 are cross sectional views showing the photomask 40 of the second preferred embodiment (FIG. 6) as it is during fabrication steps taken along the line V—V of FIG. 7. First, similarly to the fabrication of the photomask of the first preferred embodiment, the transparent substrate 11 provided thereon with the light shielding members 12 is prepared through the fabrication steps of FIGS. 13 to 16 (First and Second steps).

Figure 30:
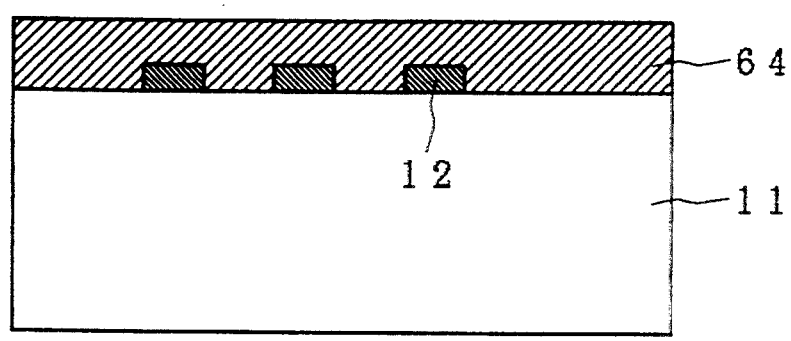
FIGS. 30 to 39 are cross sectional views showing the photomask of the second preferred embodiment during fabrication.
Figure 31:
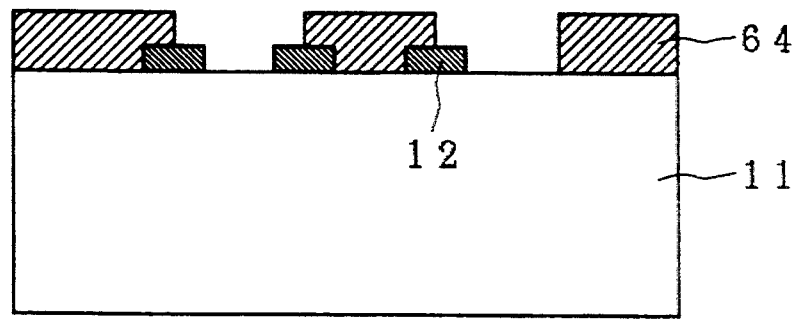
Figure 32:
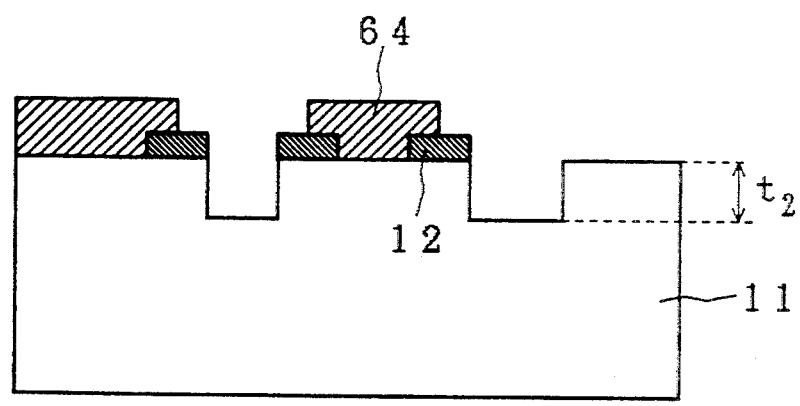
Figure 33:
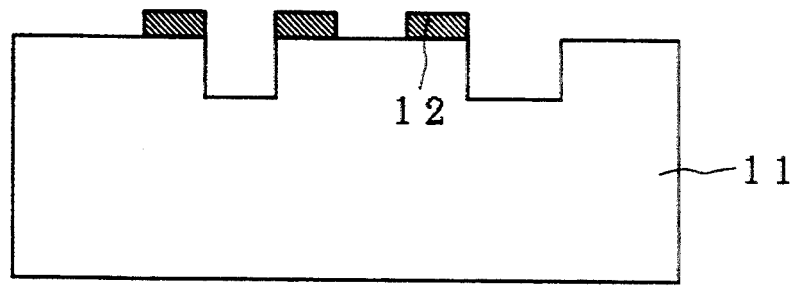

The light shielding regions and the transparent substrate are covered with a resist layer 64 as shown in FIG. 30. The resist layer 64 is then selectively removed by E-beam exposure as shown in FIG. 31, patterning the resist layer 64 into a configuration which corresponds to the main and the auxiliary phase shifting regions. The transparent substrate 11 is selectively etched to a predetermined depth at its exposed surfaces through the resist patterns 64 and the light shielding members 12, thereby selectively removing the transparent substrate 11 at regions which correspond to the main and the auxiliary phase shifting regions (FIG. 32). The etching depth $t_2$ during etching above is as that expressed by Eq. 10. In general, the etching depth $t_2$ is determined by an etching time. The resist patterns 64 are then removed so that the photomask as that shown in FIG. 33 is obtained (Third step).

Figure 34:
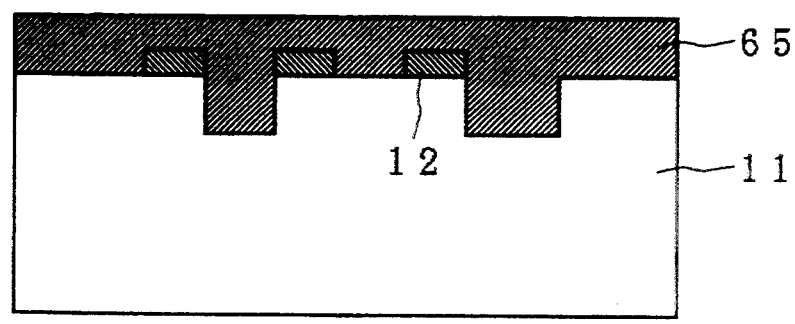
Figure 35:
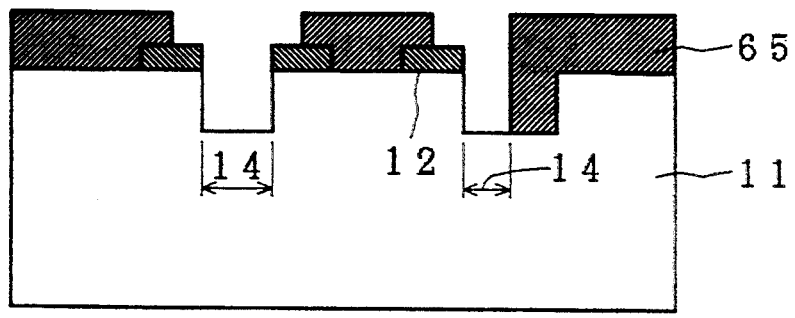
Figure 36:
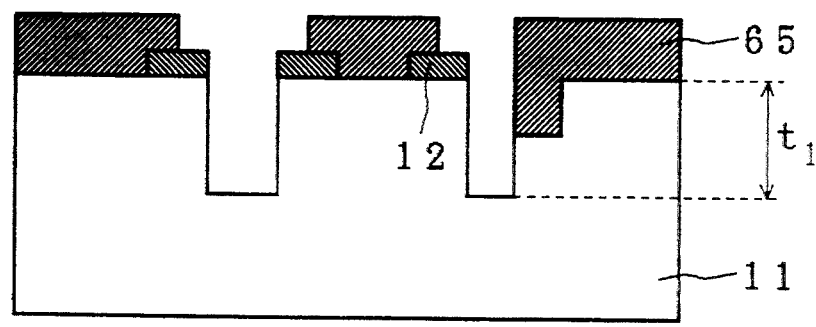
Figure 37:
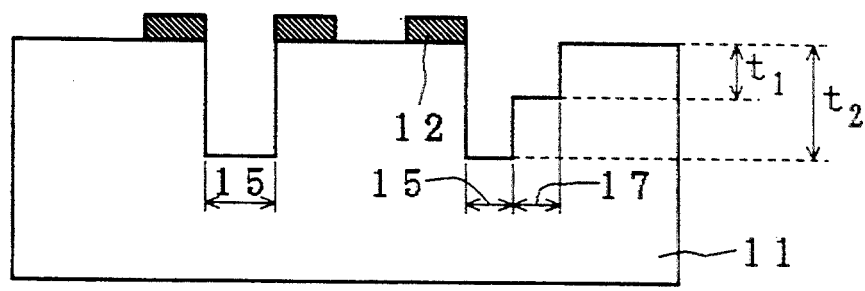

Next, as shown in FIG. 34, the light shielding regions and the transparent substrate are again covered with a resist layer. This resist layer 65 of FIG. 35 is selectively removed by E-beam exposure to form resist patterns 65 which correspond to the main phase shifting regions 14. Following this, as shown in FIG. 36, the transparent substrate 11 is selectively etched at its exposed surfaces through the resist patterns 65 and the light shielding members 12, thereby selectively removing the transparent substrate 11 to a predetermined depth $t_1$ at regions which correspond to the main phase shifting regions. The etching depth $t_1$ is as that expressed by Eq. 9, for instance. The resist patterns are then removed, completing the photomask 40 as that shown in FIG. 33 (Fourth step).

Figure 38:
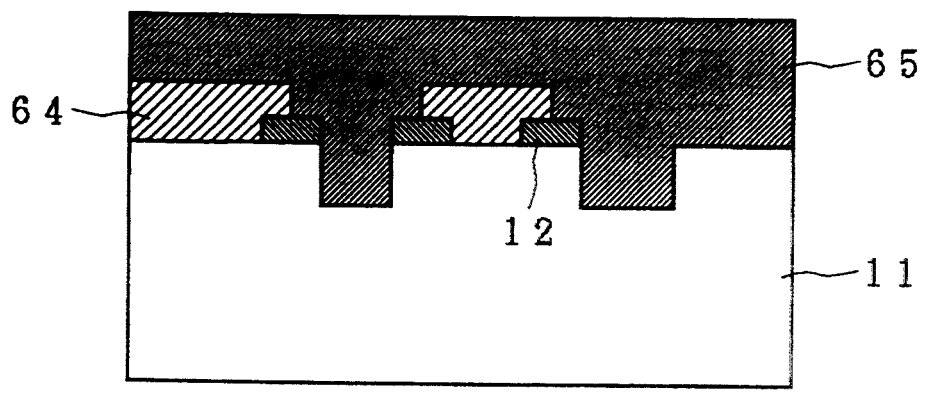
Figure 39:
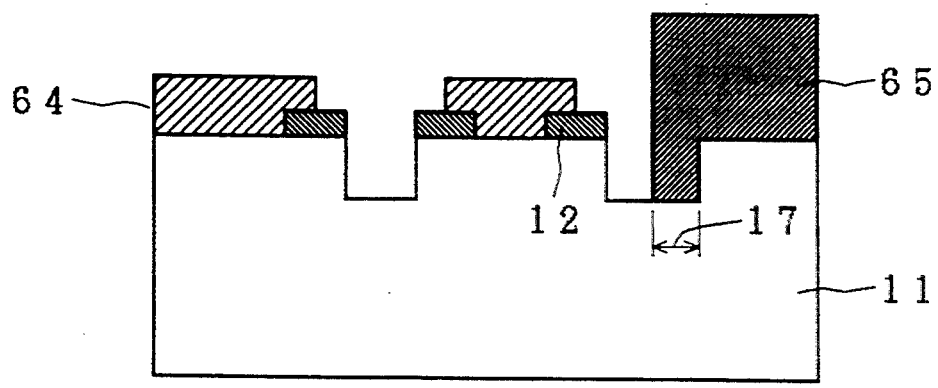

The resist patterns 64 may not be removed where the main and the auxiliary phase shifting regions are not formed as described above. Instead, the resist patterns 64 may be left as they are and covered with the resist layer 65 as shown in FIG. 38, followed by formation of the resist patterns which correspond to the auxiliary phase shifting regions 17 by E-beam exposure as shown in FIG. 39. This is more desirable in terms of omission of removal of the resist patterns 64 and easiness of formation of the resist patterns 65 since the auxiliary phase shifting regions 17 are disposed at the peripheries of the main light shielding regions 15.

While the invention has been described in detail, the foregoing description is in all aspects illustrative and not restrictive. It is understood that numerous other modifications and variations can be devised without departing from the scope of the invention.

We claim:

1. A photomask comprising:
   a transparent substrate;
   a light shielding region formed on a top major surface of said transparent substrate;
   a main phase shifting region formed on said top major surface of said transparent substrate and on one side of said light shielding region; and
   an auxiliary phase shifting region formed on said top major surface of said transparent substrate along the periphery of said main phase shifting region,
   wherein said main phase shifting region is disposed on said top major surface in such a manner that light through said main phase shifting region is out of phase from light through said top major surface and cancel each other by interference therebetween, and said auxiliary phase shifting region is disposed in such a relation to said top major surface and said main phase shifting region that a phase difference between light through said top major surface and light through said auxiliary phase shifting region and a phase difference between light through said auxiliary phase shifting region and light through said main phase shifting region are each smaller than the phase difference between light through said top major surface and light through said main phase shifting region, wherein the phase difference between light through said top major surface and light through said main phase shifting region is 180 degrees and the phase differences between light through said top major surface and light through said auxiliary phase shifting region and between light through said auxiliary phase shifting region and light through said main phase shifting region are each 90 degrees.

2. The photomask of claim 1, wherein said light shielding region includes a plurality of light shielding regions which are arranged parallel to each other, and said one side of said light shielding region on which said main phase shifting region is formed includes outer side of outermost one of said plurality of said light shielding regions.

3. The photomask of claim 1, wherein said main phase shifting region includes a relatively deep first groove and said auxiliary phase shifting region includes a relatively shallow second groove which is shallower than said first groove.

4. The photomask of claim 1, wherein said main phase shifting region includes a relatively thick first phase shifting film and said auxiliary phase shifting region includes a relatively thin second phase shifting film which is thinner than said first phase shifting film.

5. The photomask of claim 4, wherein at a border between said first and said second phase shifting films, edges of said first and said second phase shifting films are not aligned to each other.

6. The photomask of claim 4, wherein at a border between said first and said second phase shifting films, edges of said first and said second phase shifting films are aligned to each other.

7. The photomask of claim 4, wherein said first phase shifting film includes a film made of an inorganic material.

8. The photomask of claim 7, wherein said second phase shifting film includes a film made of an inorganic material.

9. The photomask of claim 8, wherein said first and said second phase shifting films are made of different materials.

10. The photomask of claim 7, wherein said second phase shifting film includes a film made of an organic material.

11. The photomask of claim 4, wherein said first phase shifting film includes a film made of an organic material.

12. The photomask of claim 11, wherein said second phase shifting film includes a film made of an organic material.

13. The photomask of claim 12, wherein said first and said second phase shifting films are made of different materials.

14. The photomask of claim 11, wherein said second phase shifting film includes a film made of an inorganic material.

15. The photomask of claim 1, wherein said auxiliary phase shifting region is formed by a plurality of auxiliary phase shifting parts which are disposed to encircle said main phase shifting region one farther than the other, and a phase difference between an outer auxiliary phase shifting part and said main phase shifting film is smaller than a phase difference between an inner auxiliary phase shifting part and said main phase shifting film.

16. The photomask of claim 15, wherein said light shielding region includes a plurality of light shielding regions which are arranged parallel to each other, and said one side of said light shielding region on which said main phase shifting region is formed includes outer side of outermost one of said plurality of said light shielding regions.

17. The photomask of claim 15, wherein said plurality of said auxiliary phase shifting parts include a plurality of grooves which are formed on said transparent substrate to encircle said main phase shifting region one farther than the other, and an outer groove is shallower than an inner groove.

18. The photomask of claim 15, wherein said plurality of said auxiliary phase shifting parts include a first and a second auxiliary phase shifting parts, and light through said first auxiliary phase shifting part is +120 degrees out of phase from light through said top major surface while light through said second auxiliary phase shifting part is +60 degrees out of phase from light through said top major surface.

19. The photomask of claim 15, wherein said main phase shifting region includes a relatively thick first phase shifting film and said auxiliary phase shifting parts include a plurality of relatively thin second phase shifting films which are thinner than said first phase shifting film, said plurality of said second phase shifting films are formed on said transparent substrate to encircle said main phase shifting region one farther than the other, and outer one of said second phase shifting films is thinner than inner one of said second phase shifting films.

20. The photomask of claim 19, wherein said first phase shifting film includes a film made of an inorganic material.

21. The photomask of claim 20, wherein said second phase shifting films include films made of an inorganic material.

22. The photomask of claim 21, wherein said first and said second phase shifting films are made of different materials.

23. The photomask of claim 22, wherein said second phase shifting films are made of different materials.

24. The photomask of claim 20, wherein said second phase shifting films include films made of an organic material.

25. The photomask of claim 24, wherein said second phase shifting films are made of different materials.

26. The photomask of claim 19, wherein said first phase shifting film includes a film made of an organic material.

27. The photomask of claim 26, wherein said second phase shifting films include films made of an organic material.

28. The photomask of claim 27, wherein said first and said second phase shifting films are made of different materials.

29. The photomask of claim 28, wherein said second phase shifting films are made of different materials.

30. The photomask of claim 26, wherein said second phase shifting film includes a film made of an inorganic material.

31. The photomask of claim 30, wherein said second phase shifting films are made of different materials.

32. A method of manufacturing a photomask, comprising the steps of:

preparing a transparent substrate having a light shielding region on its top major surface;

forming an auxiliary phase shifting region on said top major surface of said transparent substrate on one side of said light shielding region and in space from said light shielding region; and forming a main phase shifting region on said top major surface of said transparent substrate between said light shielding region and said auxiliary phase shifting region, said method being characterized in that:

said main phase shifting region is disposed on said top major surface in such a manner that light through said main phase shifting region is out of phase from light through said top major surface and cancel each other by interference therebetween; and said auxiliary phase shifting region is disposed in such a relation to said top major surface and said main phase shifting region that a phase difference between light through said top major surface and light through said auxiliary phase shifting region and a phase difference between light through said auxiliary phase shifting region and light through said main phase shifting region are each smaller than the phase difference between light through said top major surface and light through said main phase shifting region, wherein said step of forming said auxiliary phase shifting region includes the step of forming a relatively thin first phase shifting film and said step of forming said main phase shifting region includes the step of forming a relatively thick second phase shifting film which is thicker than said first phase shifting film.

33. The method of claim 32, wherein said step of forming said second phase shifting film includes the step of forming said second phase shifting film such that edges of said first and said second phase shifting films are not aligned to each other at a border between said first and said second phase shifting films.

34. The method of claim 32, wherein said step of forming said second phase shifting film includes the step of forming said second phase shifting film such that edges of said first and said second phase shifting films are aligned to each other at a border between said first and said second phase shifting films.

35. The method of claim 32, wherein said light shielding region includes a plurality of light shielding regions which are arranged parallel to each other, and said one side of said light shielding region on which said main phase shifting region is formed during formation of said second phase shifting film includes outer side of outermost one of said plurality of said light shielding regions.

36. The method of claim 35, wherein said first and said second phase shifting films are made of different materials.

37. The method of claim 32, wherein
said step of forming said auxiliary phase shifting region includes the step of forming a relatively shallow first groove,
said step of forming said main phase shifting region includes the step of forming a relatively deep second groove which is deeper than said first groove,
said step of forming said first groove includes the steps of:
forming a first resist film in an exposed region of said transparent substrate where said light shielding region is not provided so that said first resist film is formed in at least said exposed region of said transparent substrate where said first and said second grooves are not formed; and
etching said transparent substrate through said first resist film by a predetermined depth which said first groove must have,
said step of forming said second grooves includes the steps of:
forming a second resist film at least on said first groove without processing said first resist film; and
etching said transparent substrate through said second resist film by a predetermined depth which said second grooves must have.

38. A photomask comprising:
a transparent substrate having a top major surface which allows light to pass through;
light shielding regions formed on the top major surface of the transparent substrate;
a main phase shifting region formed on the top major surface between adjacent light shielding regions, wherein light passes through the main phase shifting region and is phase shifted by 180 degrees with respect to the light which passes through the transparent substrate; and
an auxiliary phase shifting region formed at an entire periphery of the main phase shifting region where the main phase shifting region is not in contact with the light shielding regions, the auxiliary phase shifting region formed only on the top major surface and not formed on the main phase shifting surface and the light shielding regions, wherein
a phase difference between light which passes through the auxiliary phase shifting region and the transparent substrate and a phase difference between light which passes through the main phase shifting regions and the auxiliary region are both smaller than a phase difference between light which passes through the main phase shifting regions and the transparent substrate.

* * * * *